United States Patent [19]

Marchand et al.

[11] Patent Number: 4,482,867
[45] Date of Patent: Nov. 13, 1984

[54] MICROWAVE POWER TRANSMITTER FOR DOPPLER RADAR

[75] Inventors: Maurice Marchand; Yan Haentjens, both of Boulogne, France

[73] Assignee: LMT-Radio Professionnelle, Boulogne-Billancourt, France

[21] Appl. No.: 413,507

[22] Filed: Aug. 31, 1982

[30] Foreign Application Priority Data

Oct. 23, 1981 [FR] France .................. 81 19940

[51] Int. Cl.³ .................. H03F 3/60; H03F 3/193
[52] U.S. Cl. .................. 330/277; 330/286; 330/297; 343/17.1 R; 375/59
[58] Field of Search .......... 343/5 R, 8, 5 CM, 5 SW, 343/7 AG, 17.1 R; 455/127, 91; 330/130, 133, 134, 127, 129, 132, 277, 286, 297, 3, 59, 150; 375/3, 50, 59

[56] References Cited

U.S. PATENT DOCUMENTS

| 1,712,572 | 5/1929 | Little | 330/150 X |
| 3,061,789 | 10/1962 | Mace | 330/150 X |
| 3,113,268 | 12/1963 | Horak | 330/150 X |
| 3,287,694 | 11/1966 | Romberg | 330/127 X |
| 3,299,356 | 1/1967 | Bornhorst et al. | 455/127 X |
| 3,319,175 | 5/1967 | Dryden | 330/127 X |
| 3,737,678 | 6/1973 | Dolby et al. | 330/277 X |
| 4,011,518 | 2/1977 | Irvine et al. | 330/277 X |

FOREIGN PATENT DOCUMENTS 1572608 7/1969 France.
2448254 8/1980 France.

OTHER PUBLICATIONS

Electronic Design, FET Makes High Level Phone-Sensitive Detector, 10/25/63, Electronic Design, pp. 80-81.
Naster et al., Microwave Amplifiers, International Solid States Circuits Confer., pp. 72-73.

Primary Examiner—Maynard R. Wilbur
Assistant Examiner—Brian Steinberger
Attorney, Agent, or Firm—Oblon, Fisher, Spivak, McClelland & Maier

[57] ABSTRACT

In a microwave power transmitter for Doppler radars for terrestrial surveillance, use is made of four stages in series comprising first and second preamplifiers, and first and second power amplifiers. These stages are supplied by a group of separate voltage regulators. These regulators are controlled by a control circuit which makes it possible to cut off the stabilized voltage between instants of transmission, that is to say between microwave pulses of a radar signal. A feedback device makes it possible to stabilize the output level by causing variation of the gain of the first preamplifier by means of its supply voltage.

5 Claims, 3 Drawing Figures

MICROWAVE POWER TRANSMITTER FOR DOPPLER RADAR

BACKGROUND OF THE INVENTION

The present invention relates to microwave transmitters employing field effect transistors which make it possible to produce wholly transistorised Doppler type radars, even in the power stages of the transmitter. Such Doppler radars are used in particular for terrestrial surveillance, and it is of great importance in this case to reduce weight, bulk and power consumption. The substitution of transistors for vacuum tubes permits a substantial gain in this respect.

It is known that transistors and in particular field effect transistors may be utilised to amplify microwaves, in particular in the so-called I band situated in the region of 10 GHz. These transistors are commonly produced by using gallium arsenide as a semiconductor. These can operate on the class A mode only, giving a substantially constant consumption and a wastage of power during the idle periods consisting of the intervals between the microwave pulses characteristic of radar operation,. The power saving which could be hoped for by utilising such transistors is thus considerably reduced as compared to vacuum tubes which can operate in class C mode and which are consequently supplied only during the transmission pulses.

BRIEF SUMMARY OF THE INVENTION

The present invention provides a microwave power transmitter for Doppler radars, which comprises:
an amplifying chain formed by a plurality of stages in series provided with field effect transistors operating in class A mode for amplifying a signal formed by a sequence of microwave pulses;
a plurality of voltage regulators for separately supplying at least each stage of the amplifier chain, each regulator having an input for receiving a reference voltage determining the output voltage of the regulator, and the inputs being joined together;
a control circuit comprising a Zener diode for supplying the said reference voltage, and means for supplying this Zener diode under the control of a digital signal in phase with the microwave pulses.

BRIEF DESCRIPTION OF THE DRAWINGS

Other features and advantages of the invention will appear clearly from the following description given by way on non-limiting example and taken in conjunction with the accompanying drawings, in which.

DETAILED DESCRIPTION OF THE INVENTION

Figure 1:
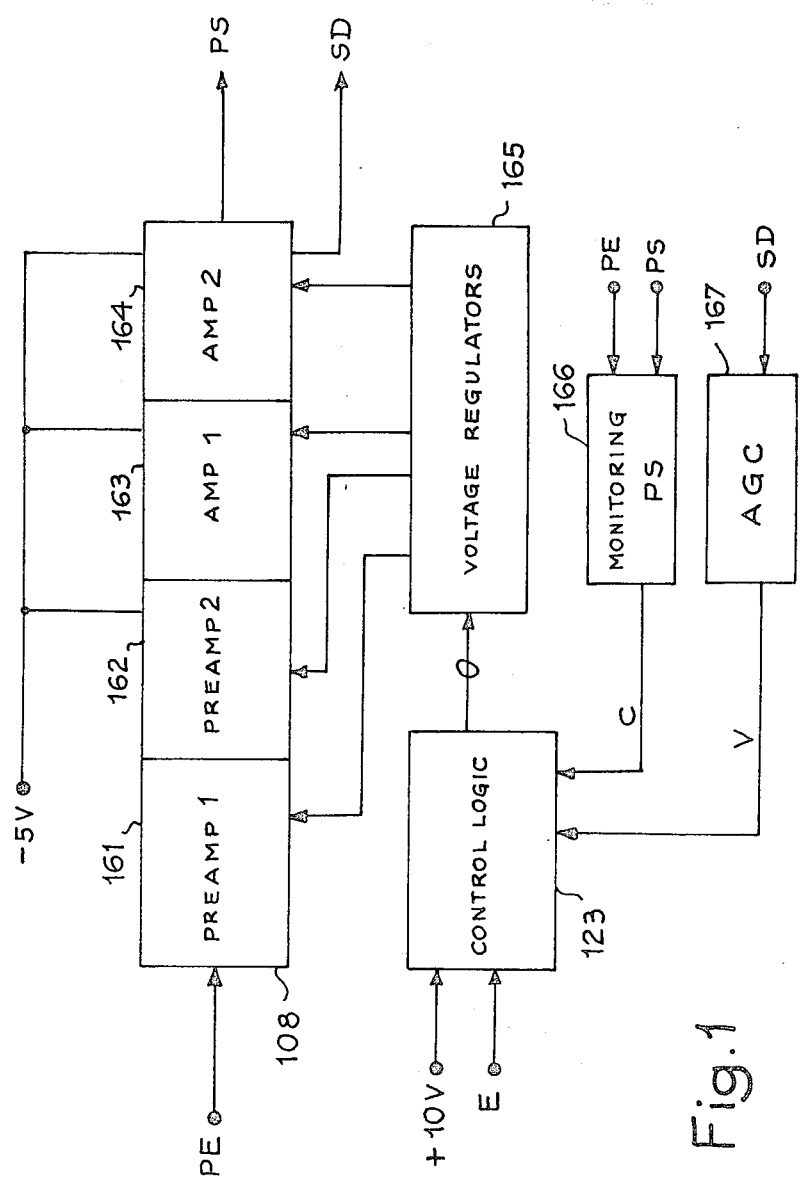
FIG. 1 is a block diagram of one embodiment of transmitter according to the invention.

The transmitter shown in block diagram form in FIG. 1 comprises amplifier elements located within a microwave structure 108 and which may be separated into a first preamplifier 161, a second preamplifier 162, a first power amplifier 163 and a second and final power amplifier 164. The signal PE which is to be transmitted is fed to the input of the preamplifier 161. It is in the form of trains of low-level microwave pulses obtained from a modulator circuit, supplied, for example, by a synthetiser. The final power amplifier 164 delivers the transmission signal PS which is in fact the appropriately amplified signal PE.

The amplifier elements contained in the structure 108 receive a biasing voltage on the one hand, of −5 Volts in this example, and on the other hand a supply voltage providing the power required and which is furnished by a plurality of voltage regulators 165. These regulators are controlled by means of a control circuit 123 which receives a raw D.C. supply voltage of +10 Volts in this example.

This control circuit also receives a particular number of signals enabling the latter to feed the voltage regulators 165 with control signals causing variation in the parameters of these regulators, in order to supply the amplifier stages in accordance with the modes which are to be described in the following. These control signals comprise a digital modulation signal E including peaks which enflank the microwave pulses of signal PE, a cut-off signal C and an analog modulation control signal V.

The cut-off signal C originates from a circuit 166 for monitoring the output signal PS. This circuit controls the time parameters of the signal PS by comparing these to the time parameters of the signal PE. It transmits a cut-off signal when it detects a difference exceeding a preset value.

The analog control signal V is obtained from an automatic gain control circuit 167 which performs a simple level matching between a signal SD obtained by rectifying the signal PS in the power stage 164, and the signal V required by the control circuit 142.

Figure 2:
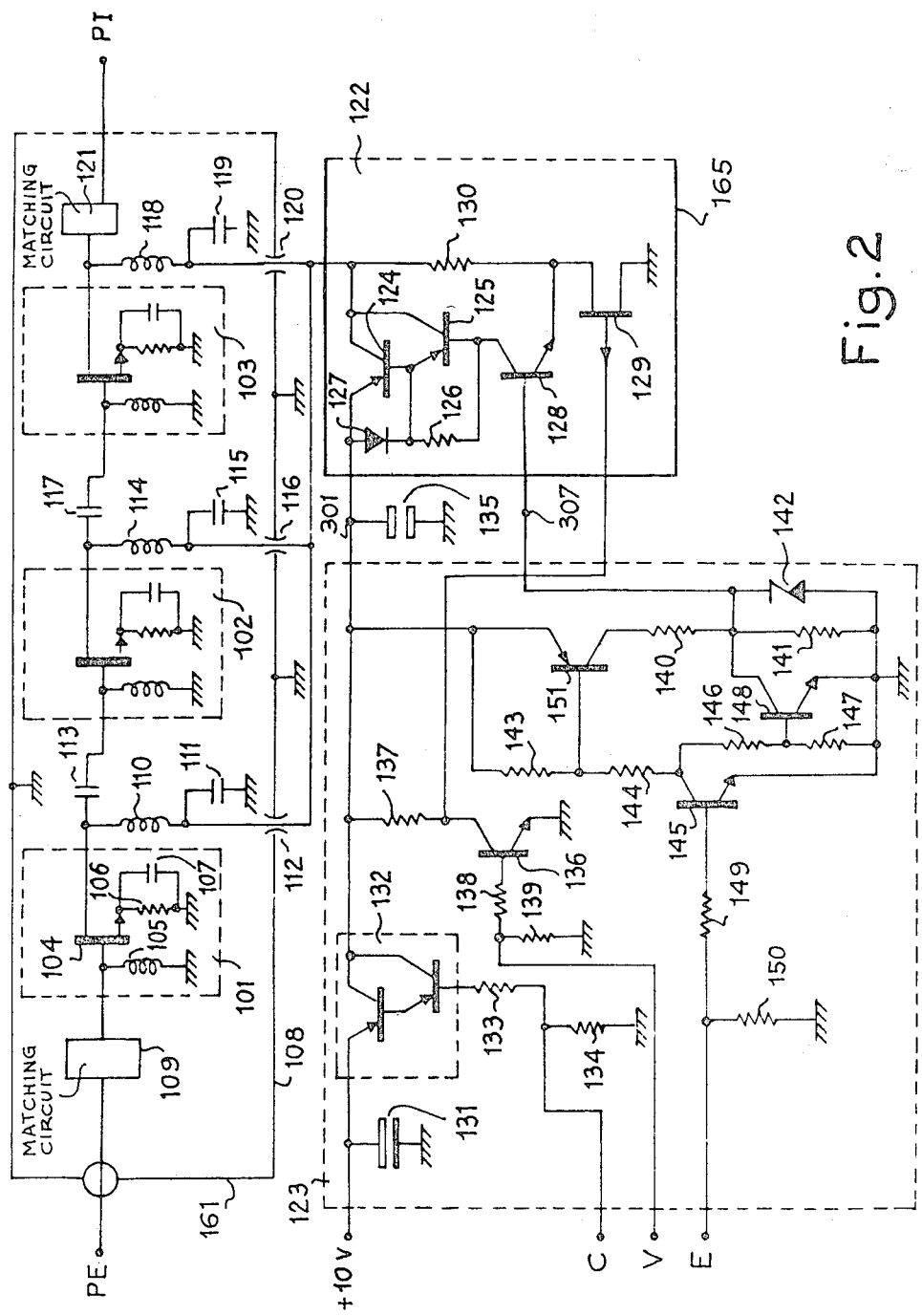
FIG. 2 is a detailed diagram of the elements 161, 123 and a partial diagram of the element 165 of FIG. 1.

The first preamplifier 161, as well as the part of the voltage regulators 165 corresponding to it, and the control circuit 142, are illustrated in FIG. 2.

In FIG. 2, three field effect transistors 101 to 103 are utilised as active microwave components by the preamplifier 161. These transistors are of the type known under the reference THC 9311-9312 and in fact comprise within a casing a gallium arsenide transistor such as 104, which is provided with elements enabling prematching and self biasing. These elements comprise a shock inductance 105 which connects the grid of the transistor to earth as regards direct current, and a biasing resistor 106 which connects the source to earth and which is shunted by a decoupling capacitor 107. These elements, as well as the conductors connecting the transistor to the output terminals of the casing in which it is disposed, provide a very simple arrangement, since it does not require any external biasing components, and a minimum of external components for matching to the circuits in which it is installed.

These three transistors are mounted in the microwave structure 108, produced according to a known technique as a metal block in which are recessed cavities receiving the different members, whilst insulating the stages from each other to permit intercommunication only via connections passing through the partitions situated between these cavities, through suitable openings.

The first amplifier stage is fed by the input signal PE which is fed to the grid of the first transistor 101 via a matching circuit 109, which is not illustrated in detail in the drawing since it essentially comprises, in a manner known in the art, an impedance transformer enabling the comparatively low impedance of the grid of the transistor to be matched to the larger one of the external circuits which feed the transistor, and of which the value, is according to current microwave practice, for example 50 Ohms.

The source resistance of the transistor 101 is connected to earth on the structure 108 and its drain is supplied with direct current via a load inductance 110 decoupled to earth by a decoupling capacitor 111 and by a by-pass capacitor 112. The inductance 110 is shown in the form of a coil for ease of illustration, but bearing in mind the frequencies utilised, it is obviously in the form of a line with distributed constants, as are the other inductances of the circuit.

The output of this first stage is taken from the drain of the transistor 101 and fed to the grid of the transistor 102 which forms the second stage, via a coupling capacitor 113.

This second stage is connected in the same manner as the first by means of a load inductance 114, a decoupling capacitor 115 and a by-pass capacitor 116. It is connected to the third stage via a coupling capacitor 107.

This third stage is itself supplied via a load inductance 118, a decoupling capacitor 119 and a by-pass capacitor 120.

The output of the preamplifier is taken from the drain of the transistor 103 by means of a matching circuit 121 not shown in the drawing to simplify matters, but corresponding to current microwave technique, as the circuit 109. This matching circuit delivers an output signal PI.

The three microwave amplifier stages are supplied by the voltage regulator 122 which forms part of the set of regulators 165 and is controlled by the control circuit 123.

The regulator comprises a ballast transistor 124, whose emitter receives the positive 10 Volt supply from the control circuit 123 and whose collector delivers the regulated supply voltage to the three load impedances 110, 114 and 118.

The transistor 124 is connected in a Darlington circuit with the transistor 125 whose emitter is connected to its base via a resistor 126.

The emitter of the transistor 124 is connected to its base via a biasing diode 127.

The base of the transistor 125 is also connected to the collector of a transistor 128 whose emitter is connected to earth via the drain-source circuit of a field effect transistor 129.

The base of the transistor 128 receives a reference voltage, and the grid of the transistor 129 a control voltage.

The emitter of the transistor 128 is also connected to the collector of the transistor 124 via a resistor 130.

The arrangement thus formed represents a largely conventional regulator, but of which the output voltage is controllable by acting on the control voltage fed to the grid of the transistor 129, which acts as a variable resistance. On the other hand, it is possible to cut off or establish the output voltage of the regulator within an extremely short time which does not exceed a few tens of nanoseconds, by cancelling or establishing the reference voltage, if the speed at which this reference voltage is cut off or established is sufficiently high.

The control circuit comprises a filtering capacitor 131 which is supplied with the non-stabilised 10 Volt voltage. This filtering capacitor is connected to the supply input of the regulator 122 via a transistor 132 of the integrated Darlington type. The base of the transistor 132 is earthed via resistors 133 and 134 in series.

The common point of these two resistors is joined to an input connection of the control circuit which may receive the cut-off signal C which makes it possible to block the transistor 132 and thereby to interrupt the supply to the preamplifier upon detection of a fault, for example by means of an external circuit.

On the other hand, the supply connection between the circuits 122 and 123 is shunted to earth by a capacitor 135 joined to this connection at a point 301, which makes it possible to filter the output voltage of the circuit 123.

The control circuit 123 also comprises a transistor 136 fed from the output of the transistor 132 via a resistor 137 connected to its collector. Its emitter and its base are earthed, directly in the case of the emitter, and through two resistors 138 and 139 in series in the case of the base.

The common point of these two resistors 138 and 139 is joined to an input connection of the control circuit 123, which may receive the analog control signal V. This signal is thus amplified by the transistor 136 and is obtained with phase inversion and an adequate level on its collector. It is then fed from this collector to the grid of the field effect transistor 129 of the regulator 122. The resistance presented by the drain-source circuit of this transistor 129 consequently varies as a function of the variations of the control signal V. This makes it possible to vary the supply voltage of the amplifier stages in accordance with the variations of this signal V.

As a matter of fact in this arrangement, utilising microwave transistors referred to above, the standing wave ratio of the arrangement varies very little with the supply voltage whereas the gain varies in a very significant manner.

This makes it possible to modulate the signal PI in a perfectly simple manner and practically without stage mismatch.

The cut-off signal C makes it possible to suppress the total supply of the device, for example if a malfunction is detected in the surveillance circuit 166, for example such as the disappearance of the pulses in PS. The speed of this cut-off is not very high, in particular because of the filtering capacitor 135. In order that the preamplifier may then be modulated by the all or nothing method and be made to operate in a pulsed manner whereas the modulation attributable to the signal V would maintain operation by sustained oscillations, the control circuit moreover comprises means of supplying the base of the transistor 128 with a reference voltage which can be cut-off from the digital control signal E.

These means comprise a transistor 151 whose emitter is fed from the collector of the transistor 132 and whose collector is earthed via two resistors 140 and 141 in series. The resistor 141 is shunted by a Zener diode 142 which supplies a stabilised reference voltage to the base of the transistor 128 via a connection 307.

The base of the transistor 139 is connected to its emitter via a resistor 143 and to the collector of a transistor 145 via a resistor 144.

The emitter and the collector of the transistor 145 are connected to earth, the first directly, and via two series resistors 146 and 147 in the case of the second. The common connection of these two resistors is connected to the base of a transistor 148 whose emitter is earthed and whose collector is connected to the cathode of the diode 142.

The base of the transistor 145 is earthed via two resistors 149 and 150 in series.

The digital control signal E is fed to an input terminal of the circuit 123 which is connected to the common point of the resistors 149 and 150.

Thus, a digital control signal, for example compatible with TTL circuits, fed to this input E causes the reference voltage supplied to the regulator 122 to vary between a zero value and the actual reference value, by reproducing the variations of this digital signal. The preamplifier thus operates by pulses, but the signal within these pulses remains in the class A mode.

Figure 3:
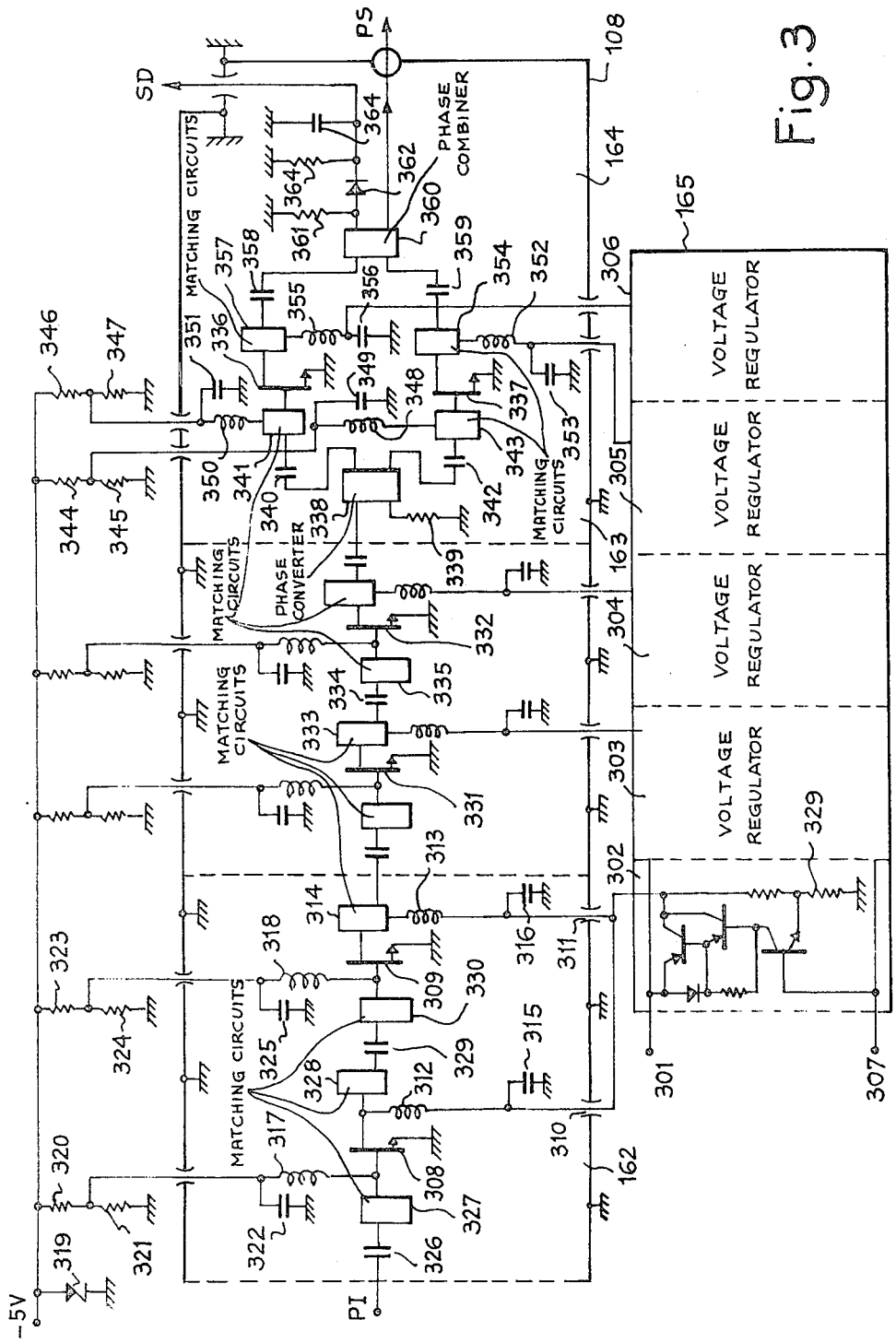
FIG. 3 is a detailed diagram of the elements 162 to 164 and a partial diagram of the element 165 in FIG. 1.

The output signal PI of the preamplifier 161 is fed to the input of the second preamplifier 162 illustrated in FIG. 3 together with its voltage regulator 302.

This second preamplifier is provided with two transistors 308 and 309 in series. The first transistor 308 makes it possible to deliver a power of 60 milliwatts, with a drain-source voltage of 8 Volts and a drain current of 60 milliamps. The second transistor 309 makes it possible to deliver a power of 200 milliwatts, with a drain current of 100 milliamps and the same drain-source voltage of 8 Volts, which is common to all the transistors of the four stages 162 to 164 moreover.

This voltage is applied from the regulator 302 forming part of the group of regulators 165, via connections which enter the microwave structure 108 via capacitors 310 and 311 of the by-pass type. It is supplied to the drain of the transistor 308 via an inductance 312, and to the drain of the transistor 309 via an inductance 313 in series with a matching circuit 314 which has not been described earlier for reasons of clarity and because its technology is quite familiar in the art. These two inductances are decoupled to earth by decoupling capacitors 315 and 316.

The grids of the transistors are biased by voltages tapped off resistance bridges supplied with the negative biasing voltage of −5 Volts, which for its part is stabilised by a Zener diode. A bridge formed by two resistors 320 and 321 in series feeds the drain of the transistor 308 via a surge inductance 317 decoupled to earth by a capacitor 322. Similarly, a bridge formed by two resistors 323 and 324 in series feeds the drain of the transistor 309 via a surge inductance 318 decoupled to earth by a capacitor 325. The values of the bridge resistors are determined so that the grids are biased in such a manner that the transistors deliver currents corresponding to the intensities referred to above.

The output signal PI of the first preamplifier 161 is fed to the grid of the transistor 308 via a coupling capacitor 326 in series with an impedance matching circuit 327.

The signal amplified by the transistor 308 is supplied to the grid of the transistor 309 via an impedance matching circuit 328 and then via a coupling capacitor 329 and another impedance matching circuit 330.

The impedance matching circuit 314 makes it possible to extract the output signal of the second preamplifier 162 at the drain of the transistor 309.

The signal thus obtained is fed to the first amplifier 163 comprising two transistors 331 and 332 in series. The transistor 331 renders it possible to raise the signal power to 400 milliwatts with a drain current of 200 milliamps, and the transistor 332 raises this power to 1 watt with a drain current of 500 milliamps. The layout of this stage is similar to that of the preceding one, and the description will be confined to the differences.

A first difference consists in the impedance matching circuit 333 which connects the drain of the transistor 331 to the grid of the transistor 332 via a coupling capacitor 334 and another impedance matching circuit 335. By contrast to the matching circuit 329 of the first transistor of the second preamplifier, which is of the dipole type, this matching circuit 333 if of the quadripole type and thus similar to the circuit 314, Furthermore, the transistor supply is provided separately from two regulators 303 and 304, because of the power applied and to avert any risk of coupling at the supply level.

To secure the required power of 2 watts for the output signal PS, use has been made of two transistors 336 and 337 of the same type as the transistor 332, but connected in parallel and each delivering 1 watt with a drain current of 500 milliamps.

To feed appropriate signals to the grids of these transistors, the output signal from the first preamplifier 163 is split into two parts out of phase by 90 degrees by means of a phase converter 338 of a common type in the art of microwaves, of which one input is connected to the output of the amplifier 163 and the other input to earth via a balancing resistor 339.

The signals thus obtained at the two outputs of this phase converter are fed to the grid of the transistor 336 via a decoupling capacitor 340 in series with an impedance matching circuit 341 in the case of the one, and the other is fed to the grid of the transistor 337 via a coupling capacitor 342 in series with a matching circuit 343.

Furthermore, the grid of the transistor 337 is biased from a bridge of resistors 344,345 supplied with −5 Volts, via a surge inductance 348 supplying the impedance matching circuit 343. This inductance is decoupled from earth by a decoupling capacitor 349.

Similarly, the grid of the transistor 336 is biased by a bridge of resistances 346,347, a surge inductance 350 and a decoupling capacitor 351.

The drain of the transistor 337 is supplied from a voltage regulator via a shock inductance 351 and an impedance matching circuit 354. This inductance 352 is decoupled by a capacitor 353. The circuit is locked by the source of the transistor 337 which is earthed. Similarly, the transistor 336 is supplied by a final voltage regulator 306 and via a shock inductance 355, a decoupling capacitor 356 and an impedance matching circuit 357.

The output signals of the two coupling circuits 354 and 357 are fed, via two coupling capacitors 358 and 359, to the input of a recombiner circuit 360 known in the art, which operates in the opposite manner to that of the phaser converter 338 and is very similar to the latter. One of the outputs of this circuit delivers the required signal PS at an output power of 2 watts and the other output is locked to earth via a balancing resistor 361.

In order to obtain an indication of the output power, which by way of the automatic gain control circuit 167 makes it possible to deliver the analog control signal which, through the control circuit 123, makes it possible to control the voltage regulators 165 and thereby to regulate the output power to its rated value, the signals at the output of the circuit 360 connected to the resistor 361 are rectified via a diode 362 which charges a capacitor 363, connected to earth on the other hand and shunted by a resistor 364. The signal SD which indicates the output power of the transmitter is thus obtained at the cathode of the diode 362.

The regulators 302 to 306 are identical to each other and only the circuit of the regulator 302 has been illustrated. Since this circuit is identical to that of the regulator 122 except for one element, this latter alone has been indicated in the Figure. As a matter of fact, since it is unnecessary to modulate in an analogous manner the voltage fed to the power stages formed by the second preamplifier 162 and the amplifiers 163 and 164, the field effect transistor 129 operating as a variable resistance from the analog modulation signal V has been replaced by a fixed value resistor rated so that the regulator output voltage is 8 Volts.

The regulator receives the voltage to be regulated from the point 301, and its reference voltage from the connection 307 connected to the cathode of the Zener diode 142.

It is thus possible with this arrangement to supply all the transistors of the microwve power transmitter with a voltage which is present only at the instant required, that is to say during the periods of the microwave pulses. During transmissions of these pulses, the transistors operate in class A mode which is necessary, but in their absence, the power transmitter is cut off and consumes only an extremely low power, corresponding to maintenance of the different biasings. It is thus that in the embodiment described, it has proved to obtain an output power of 2 watts between 9.3 and 9.9 GHz for 4 kHz recurrence pulses of which the modulation capability varies from 1 thousandth, or say a pulse of 250 ns, to 6 hundredths, or say a pulse of 15 $\mu$s.

What is claimed is:

1. A microwave power transmitter for Doppler radars, which comprises:
   an amplifying chain formed by a plurality of stages in series provided with field effect transistors operating in Class A mode for amplifying a signal formed by a sequence of microwave pulses;
   a plurality of voltage regulators for separately supplying at least each stage of the amplifying chain, each regulator having an input for receiving a reference voltage determining the output voltage of the regulator, and the inputs being joined together;
   a control circuit comprising a Zener diode for supplying the said reference voltage, and means for supplying this Zener diode under the control of a digital signal in phase with the microwave pulses.

2. A transmitter according to claim 1, in which the first stage of the amplifier chain is a preamplifier of which the gain varies with the supply voltage, the voltage regulator feeding this first stage comprises a field effect transistor which acts as a variable resistance to control the output voltage of the said regulator, and the control circuit furthermore comprises means for rectifying a fraction of the output signal of the transmitter, and means for amplifying this rectified signal and feeding a signal to the grid of said transistor acting as a variable resistance for automatic control of the gain of the preamplifier.

3. A transmitter according to claim 2, in which the control means further comprise a switching transistor for supplying the regulators with a primary voltage which is to be regulated, and which moreover comprises means for controlling the output signal and for supplying the base of the switching transistor with a cut-off signal when the characteristics of the output signal depart from a set of predetermined limits.

4. A transmitter according to claim 3, which comprises four stages wherein the first stage is a first preamplifier comprising three transistors connected in series, the second stage is a second preamplifier comprising two transistors connected in series, the third stage is a first power amplifier having two transistors connected in series, and the fourth stage is a final power amplifier having two transistors connected in parallel.

5. A transmitter according to claim 4, which comprises six voltage regulators of which the first two respectively supply the two preamplifiers, and the other four respectively supply the four transistors of the two power amplifiers.

* * * * *